(12) United States Patent
Puckett et al.

(10) Patent No.: US 11,415,070 B2
(45) Date of Patent: Aug. 16, 2022

(54) METHOD AND SYSTEM FOR IDENTIFICATION OF FUEL INJECTOR

(71) Applicant: Caterpillar Inc., Peoria, IL (US)

(72) Inventors: Daniel R. Puckett, Peoria, IL (US); Michael E. Sattler, Eureka, IL (US); Dustin K. Fee, Peoria, IL (US); Gregory L. Armstrong, Edwards, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 17/102,490

(22) Filed: Nov. 24, 2020

(65) Prior Publication Data

US 2022/0163006 A1 May 26, 2022

(51) Int. Cl.
*F02D 41/22* (2006.01)
*F02M 51/00* (2006.01)
*G01R 19/165* (2006.01)
*F02D 41/30* (2006.01)

(52) U.S. Cl.
CPC ......... *F02D 41/22* (2013.01); *F02D 41/3076* (2013.01); *F02M 51/00* (2013.01); *G01R 19/165* (2013.01); *F02D 2041/224* (2013.01); *F02D 2200/0618* (2013.01)

(58) Field of Classification Search
CPC ........ F02D 41/22; F02D 41/221; F02D 41/30; F02D 41/3005; F02D 2041/224; F02D 2041/227; F02D 2041/228; F02M 65/00
USPC .............................. 101/107, 114; 73/114.45
See application file for complete search history.

(56) References Cited

U.S. PATENT DOCUMENTS

| 6,257,205 | B1 | 7/2001 | Calvas et al. |
| 6,360,161 | B1 * | 3/2002 | Francis ............... F02D 41/2422 123/486 |
| 9,097,225 | B2 | 8/2015 | Qiao et al. |
| 10,060,374 | B2 | 8/2018 | Shen et al. |
| 2004/0025844 | A1 * | 2/2004 | Rodriguez-Amaya ...................... F02M 65/00 123/446 |
| 2007/0001545 | A1 * | 1/2007 | Schoor .................. F02M 65/00 310/317 |
| 2011/0141642 | A1 * | 6/2011 | Oura ................... H03K 17/0822 361/93.1 |
| 2014/0020661 | A1 * | 1/2014 | Nishimura .......... F02D 41/3005 123/480 |
| 2014/0311459 | A1 * | 10/2014 | Katsurahara ............ F02D 41/30 123/478 |
| 2015/0053184 | A1 * | 2/2015 | Ruth .................. F02M 63/0225 123/478 |
| 2016/0138544 | A1 * | 5/2016 | Bjurefors .............. F02D 41/263 73/114.51 |

(Continued)

FOREIGN PATENT DOCUMENTS

DE 102013016207 A1 4/2015

*Primary Examiner* — Robert A Werner
(74) *Attorney, Agent, or Firm* — Bookoff McAndrews PLLC (57) ABSTRACT

A method for identifying a fuel injector characteristic may include generating a signal to supply electrical current to the fuel injector, and monitoring the electrical current supplied to the fuel injector. The method may also include identifying the characteristic of the fuel injector based on the electrical current, the characteristic including a type of fuel injector, and performing a corrective action based on the type of fuel injector which was identified based on the electrical current.

20 Claims, 4 Drawing Sheets

(56) References Cited

U.S. PATENT DOCUMENTS

| | | | |
|---|---|---|---|
| 2018/0045132 A1* | 2/2018 | Han | F02D 41/38 |
| 2018/0142643 A1* | 5/2018 | Fukuda | H03M 1/68 |
| 2018/0171920 A1* | 6/2018 | Gargiso | F02D 41/2096 |
| 2020/0080507 A1* | 3/2020 | Kogo | F02D 41/345 |

* cited by examiner

METHOD AND SYSTEM FOR IDENTIFICATION OF FUEL INJECTOR

TECHNICAL FIELD

The present disclosure relates generally to systems for internal combustion engines, and more particularly, to methods and systems for identifying one or more characteristics of a fuel injector installed in an internal combustion engine.

BACKGROUND

Internal combustion engines involve the interaction of a number of complex components, including parts that are regularly replaced or upgraded. Some engines include electronic control units that have programming to control the operation of one or more components of the engine, such as fuel injectors, based on the design, expected response, or other qualities of the engine component. Some electronic controls unit include programming to modify aspects of fuel injector control based on qualities of the installed injector. These injector qualities can be provided to the electronic control unit by uploading a program to the control unit, or by inputting a predetermined code associated with a particular injector. If an injector with differing features is subsequently installed, the control unit can be provided with new programming associated with this new injector. However, performance issues can arise when an injector is installed without updating the control unit. Performance is also impaired when the control unit is updated incorrectly, for example by providing an incorrect code or program to the control unit. A control unit that is improperly configured can inject a larger or smaller quantity of fuel than intended, which can result in increased emissions of unwanted exhaust components, such as smoke, or engine damage. Improper configuration of the control unit can have other adverse effects on the performance of the engine. For example, an improperly configured control unit can cause poor fuel economy, low engine power, rough idle, and increased wear.

A method for diagnosing a magnetically-driven valve of a fuel injector is described in DE 102013016207 (the '207 publication) to Kalenborn. The method described in the '207 publication applies boost currents to an injector and analyzes a frequency of a holding current to detect the presence of build-up on the injector, such as deposits. The method described in the '207 publication utilizes different boosted current levels to facilitate the detection of these deposits. While the method described in the '207 publication may be useful for detecting build-up of deposits, it may be unable to determine a characteristic of a fuel injector, such as a type of the injector. Additionally, the method described in the '207 publication may not be useful for determining when a control unit is provided with suitable programming for a particular injector.

The disclosed method and system may solve one or more of the problems set forth above and/or other problems in the art. The scope of the current disclosure, however, is defined by the attached claims, and not by the ability to solve any specific problem.

SUMMARY

In one aspect, a method for identifying a fuel injector characteristic may include generating a signal to supply electrical current to the fuel injector, and monitoring the electrical current supplied to the fuel injector. The method may also include identifying the characteristic of the fuel injector based on the electrical current, the characteristic including a type of fuel injector, and performing a corrective action based on the type of fuel injector which was identified based on the electrical current.

In another aspect, a method for identifying a fuel injector may include supplying a test current to a circuit for controlling the fuel injector of an internal combustion engine, the circuit including a solenoid and monitoring the test current supplied to the solenoid. The method may also include identifying a characteristic of the fuel injector based on an increase in the monitored test current, and generating a notification based on the characteristic of fuel injector.

In yet another aspect, a fuel injector system may include an internal combustion engine, a current sensor configured to generate a signal indicative of an amount of current detected in a circuit associated with a fuel injector, and a controller. The controller may be configured to generate a signal that causes current to be supplied to the circuit, which includes a solenoid of a fuel injector, monitor current supplied to the solenoid in response to the signal, and identify a type of fuel injector or an inductance associated with the fuel injector based on an increase in the monitored current. The controller may further be configured to perform an action based on the type of fuel injector or the inductance of the fuel injector.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION

Both the foregoing general description and the following detailed description are exemplary and explanatory only and are not restrictive of the features, as claimed. As used herein, the terms "comprises," "comprising," "having," including," or other variations thereof, are intended to cover a non-exclusive inclusion such that a process, method, article, or apparatus that comprises a list of elements does not include only those elements, but may include other elements not expressly listed or inherent to such a process, method, article, or apparatus. Moreover, in this disclosure, relative terms, such as, for example, "about," "substantially," "generally," and "approximately" are used to indicate a possible variation of ±10% in the stated value.

Figure 1:
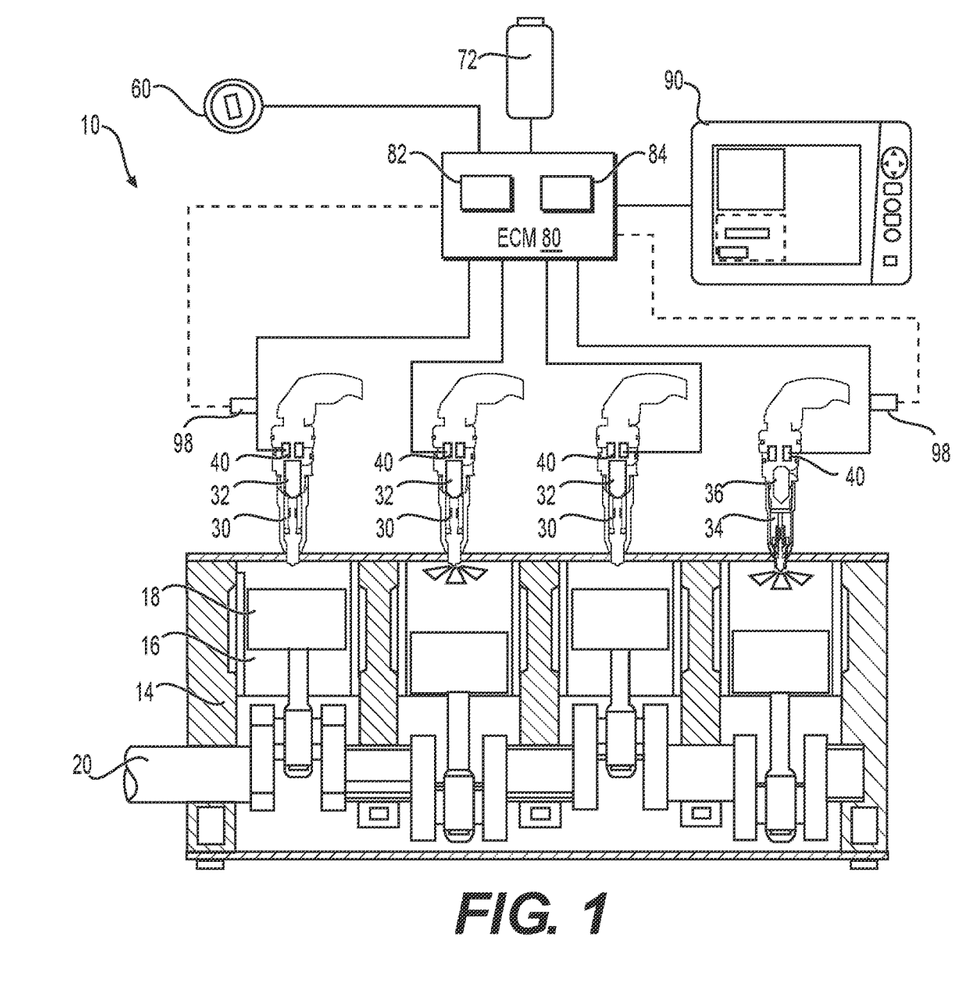
FIG. 1 is a partially schematic cross-sectional view in a fuel injection system, according to aspects of the present disclosure.

FIG. 1 illustrates an exemplary fuel injector identification and control system 10 according to an aspect of the present disclosure. Fuel injector system 10 may include an internal combustion engine 14, a plurality of first and second fuel injectors 30 and 34, a controller in communication with fuel injectors 30 and 34, such as an electronic control module (ECM) 80, a startup device 60 for starting engine 14, and a notification device 90. As will be explained in more detail below, fuel injectors 30 and 34 may be the same type of fuel injectors, or may be different types of fuel injectors, such as when a fuel injector is replaced during maintenance with an incorrect type of fuel injector. As used herein a "type" of fuel injector refers to a fuel injector associated with certain programming that allows the injector to function in a desired manner. When a fuel injector of one type is used in conjunction with programming for a different type of injector, the injector may inject fuel in a manner that adversely affects engine performance. Engine 14 may be an internal combustion engine including a plurality of cylinders 16, a series of pistons 18 positioned within each cylinder 16, and a crankshaft 20. One or more fuel injectors 30 or 34 may be secured to engine 14 to inject fuel (e.g., liquid fuel, such as diesel fuel, or gaseous fuel) toward a respective combustion chamber of cylinders 16. While four cylinders 16 are shown in FIG. 1, engine 14 may include any number of cylinders 16, such as six, eight, ten, twelve, sixteen, twenty, or more.

The plurality of fuel injectors may include one or more first fuel injectors 30 and/or one or more second fuel injectors 34. Fuel injectors 30 and 34 may be electronically-controlled injectors that include a solenoid actuation mechanism which includes one or more solenoid coils 40. Each solenoid actuation mechanism, including coils 40, may be associated with a respective control valve to facilitate the injection of predetermined quantities of fuel. Fuel injectors 30 and 34 may receive fuel from a fuel source, such as a common fuel rail, or may be configured as unit injectors. Injectors 30 and 34 may inject fuel in response to control signals generated by ECM 80 to energize the solenoid actuation mechanism. For example, first fuel injectors 30 may include a first control valve 32 configured to facilitate the injection of fuel when solenoid coils 40 are energized. Second fuel injectors 34 may include a second control valve 36 for injecting fuel when solenoid coils 40 of the injector 34 are energized. In the instance where the second fuel injector 34 is of a different type than the first fuel injectors 30, second fuel injector 34 may be operable to inject fuel when second fuel injector 34 is installed in an engine 14 with an ECM 80 programmed for first fuel injectors 30, a condition referred to herein as a "mismatch" between ECM 80 and fuel injector 34. A mismatch may also occur when one or more first fuel injectors 30 are installed in an engine 14 with an ECM 80 programmed for second fuel injectors 34.

As noted above, first fuel injectors 30 may be of a different type, i.e., have different operational or performance characteristics, as compared to second fuel injectors 34. For example, first fuel injectors 30 and second fuel injectors 34 may include respective control valves 32 and 36 that perform differently when exposed to the same control inputs. Thus, when a mismatch condition is present, the installed fuel injector (e.g., one or more first fuel injectors 30 or one or more second fuel injectors 34) may respond in an unintended manner. Valves 32 and 36 may respond differently, and inject different quantities of fuel, when the same amount of energy is supplied to solenoid coils 40, for example. These different responses may be related to design differences of second valves 36 responsible for improved performance of second fuel injectors 34 (e.g., improved longevity, responsiveness, and/or efficiency) as compared to first fuel injectors 30, as well as differences in solenoid coils 40 (e.g., differences in a number of turns in first and second injectors 30 and 34). Despite differences in performance, first and second fuel injectors 30 and 34 may have the same or similar external shapes, mechanical connections, electrical connections for wiring harnesses, or other shared qualities. These similarities may permit or allow the replacement of one or more first fuel injectors 30 with a second fuel injector 34 without the need to perform significant modifications to other components of engine 14.

A power source of system 10 may be configured to supply electrical energy to components of internal combustion engine 14 and to ECM 80, beginning a request to start engine 14 is generated with startup device 60 which may be a turn-key, button, switch, keyless ignition system, or other device. The power source of system 10 may include one or more batteries 72 that supply a battery voltage to ECM 80, injectors 30 and 34, and other components of system 10. Battery 72 may be electrically connected to one or more boosting circuits, such as exemplary boosting circuit 82 of ECM 80, for outputting an elevated voltage and thereby boosting current supplied to components of system 10, such as solenoid coils 40, as described below. While boosting circuit 82 is illustrated as being a component of ECM 80, a high voltage power supply or other voltage-boosting circuitry may be located outside of ECM 80 while being controlled by commands generated by ECM 80.

Battery 72 may be electrically connected to one or more drive circuits 84 that are configured to supply electrical energy to solenoid coils 40 in response to control signals generated by ECM 80. Like boost circuit 82, drive circuit 84 may be located outside of ECM 80, if desired. Drive circuit 84 may be configured to supply electrical energy from battery 72 to actuate fuel injectors 30 and 34 during operation of engine 14. During an initial test, described below, drive circuit 84 and boost circuit 82 may supply electrical energy having an amplitude and a duration that are both sufficiently small such that test current does not actuate injectors 30 and 34. This electrical energy may have a boosted voltage that is increased by boosting circuit 82, or a voltage approximately equal to the voltage of battery 72.

ECM 80 may be in communication with a plurality of sensors 98 (e.g., current sensors) that are configured to detect an amount of energy supplied to solenoid coils 40. Sensors 98 may monitor current supplied to coils 40 of each injector and generate a signal indicative of this current to ECM 80. While two sensors 98 depicted in FIG. 1, it is understood that sensors 98 may be provided for each respective fuel injector 30 and 34 to allow ECM 80 to monitor each individual injector installed in engine 14 and to identify at least one characteristics of each of these injectors.

ECM 80 may include a single microprocessor or multiple microprocessors configured to receive sensed inputs and generate commands to control the operation of fuel injectors 30 and 34. For example, ECM 80 may control the application of electrical energy to solenoid coils 40 to achieve a desired current through coils 40 (e.g., by controlling a quantity and timing of voltage applied to coils 40 with the use of drive circuitry 84, boosting circuitry 82, etc.). ECM 80 may be configured to control the application of electrical energy to solenoid actuators, including each solenoid coil 40. For example, ECM 80 may issue commands to drive circuitry 84 to selectively energize solenoids 40 with electrical power and may control associated circuitry to de-energize solenoids 40.

Figure 3:
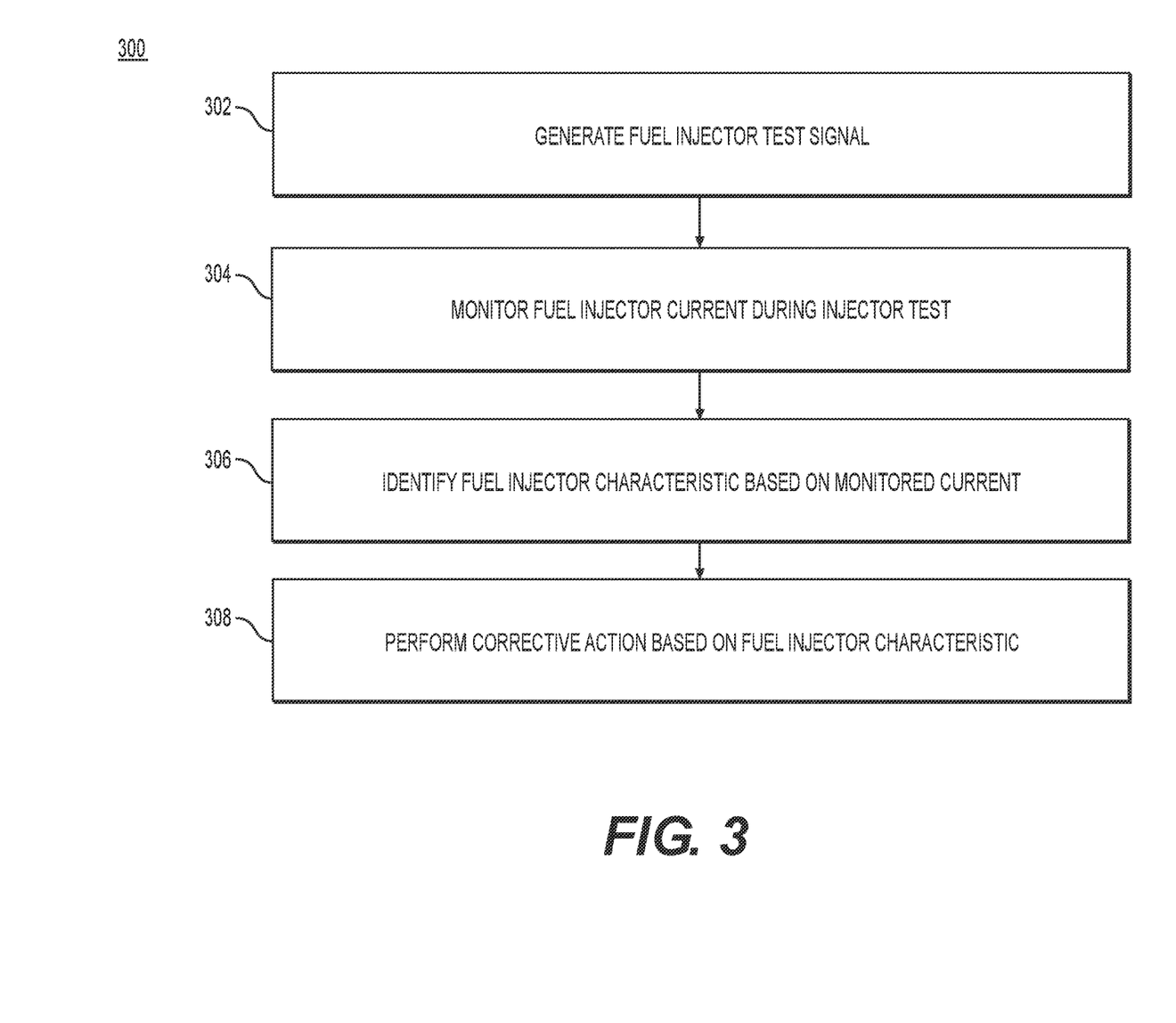
FIG. 3 is a flowchart of a method for identifying characteristics of a fuel injector of an engine system, according to aspects of the present disclosure.

ECM 80 may include a memory, a secondary storage device, processor(s), such as central processing unit(s), networking interfaces, or any other means for accomplishing a task consistent with the present disclosure. The memory or secondary storage device associated with ECM 80 may store data and software to allow ECM 80 to perform its functions, including the functions described below with respect to method 300 (FIG. 3). In particular, data and software in memory or secondary storage device(s) may allow ECM 80 to perform any of the signal analysis, injector characteristic identification, engine derating, and notification functions described herein. Numerous commercially available microprocessors can be configured to perform the functions of ECM 80. Various other known circuits may be associated with ECM 80, including signal-conditioning circuitry, communication circuitry, and other appropriate circuitry.

Notification device 90 may include one or more devices or systems associated with internal combustion engine 14. For example, notification device 90 may include a display or notification area within a cabin of a machine that is driven by engine 14. Additionally or alternatively, notification device 90 may correspond to a screen of a device in communication with ECM 80, such as a diagnostic device, a computing system, or a remote monitoring system. Notification device 90 may be in communication with ECM 80 over a wired or wireless network, such as the Internet, a Local Area Network, WiFi, Bluetooth, or any combination of suitable networking arrangements and protocols. Whether integrated into a machine with ECM 80 or incorporated in one or more remote systems, notification device 90 may include a display or screen configured to present a notification indicative of one or more characteristics, such as a type or identity, of injectors 30 and/or 34, as described below.

Figure 2:
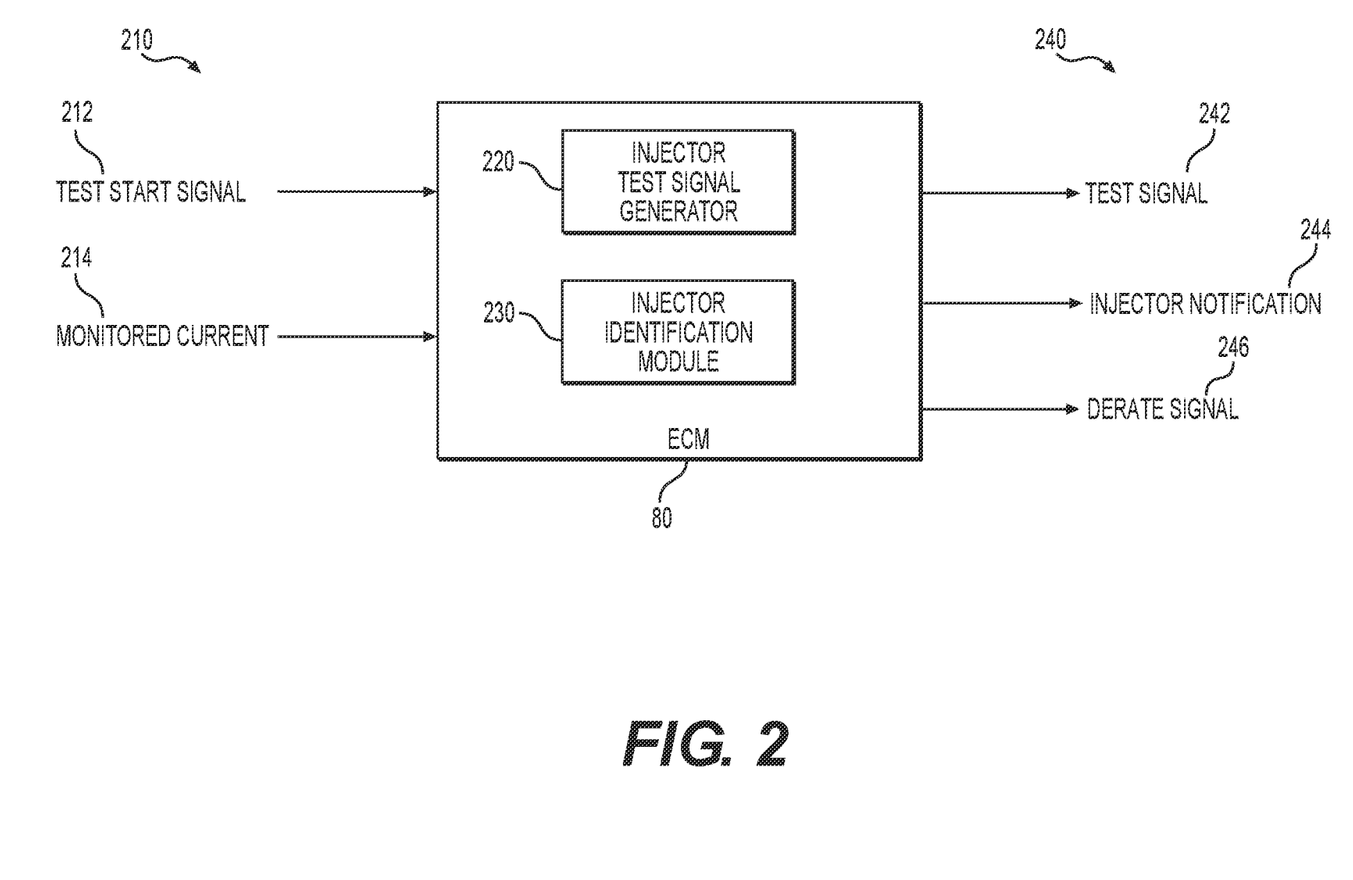
FIG. 2 is a block diagram of an exemplary engine control module of the fuel injection system of FIG. 1.

FIG. 2 illustrates an exemplary configuration of ECM 80 useful for identifying at least one characteristic of fuel injectors 30 and/or 34, and for taking one or more corrective actions based on the identified characteristic. In particular, ECM 80 may be configured to identify a type of fuel injector and/or an inductance of a fuel injector, and to take a corrective action in response to a determination that an injector has been installed without providing a matching fuel injector control configuration (e.g., a fuel injector control program) of ECM 80 for the installed injector(s).

ECM 80 may receive one or more inputs 210, including a test start signal 212 and a monitored current 214. Test start signal 212 may be an engine start signal generated by a user interaction with startup device 60 (e.g., turning a key to start operation of engine 14). Test start signal 212 may correspond to a command to power up systems associated with engine 14, and may enable ECM 80 to perform a test when engine speed is approximately zero (e.g., before fuel is combusted in engine 14 following an interaction with startup device 60). In response to receiving test start signal 212, ECM 80 may perform one or more tests or checks on systems and components for controlling engine 14, which may include method 300 described below. Monitored current 214 may be indicative of an amount of current supplied to solenoid coils 40 of each injector of engine 14, and may correspond to signals generated by sensors 98 (FIG. 1). Monitored current 214 may be received as a plurality of monitored current signals, each signal corresponding to a particular injector. This may allow ECM 80 to associate a particular current waveform of monitored current 214 with an injector at a known location of engine 14. ECM 80 may receive additional inputs 210 useful for monitoring and controlling engine 14. For example, ECM 80 may receive information from engine speed sensors, temperature sensors, acceleration sensors, airflow sensors, fuel rate sensors, and pedal position sensors, among others.

ECM 80 may include one or more modules to facilitate the identification of characteristics of injectors 30 and/or 34. For example, ECM 80 may include an injector test signal generator 220 and an injector identification module 230.

Figure 5A:
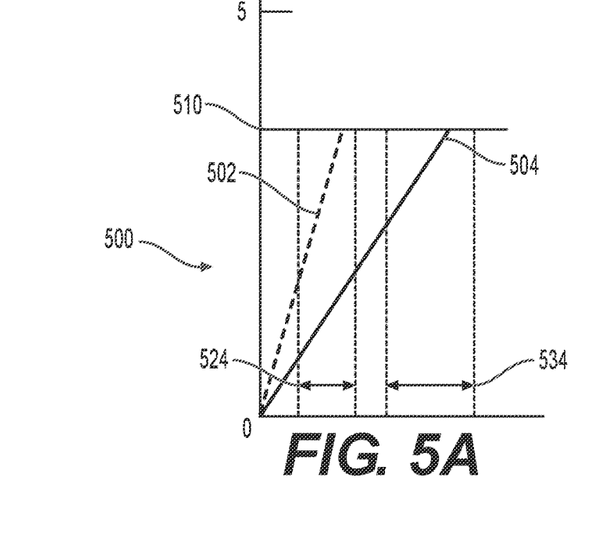
FIGS. 5A and 5B are charts illustrating exemplary analyses for detecting a type of fuel injector, according to aspects of the present disclosure.
Figure 5B:
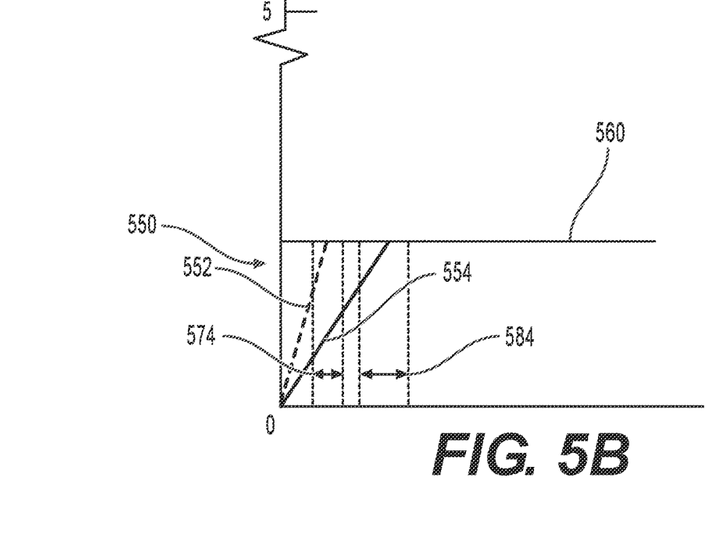

Injector test signal generator 220 may be configured to generate test signals that supply energy to solenoid 40 of an injector at a location known to ECM 80. Injector test signal generator 220 may store a plurality of test signals that are useful for identifying respective injector characteristics (e.g., different inductances associated with a particular injector). For example, each test signal stored in signal generator 220 may have a relatively higher accuracy for identifying a particular type of injector. The waveforms generated with injector test signal generator 220 may be useful for identifying a particular type of injector based on an inductance associated with a solenoid actuator employed in the particular type of injector. For example, test signals generated with generator 220 may supply energy until a predetermined current limit is reached, as described below with respect to predetermined limit current 510 and 560 (FIGS. 5A and 5B). Generator 220 may associate a plurality of current limits with one or more injector types, such as injectors 30 and 34.

Injector identification module 230 may store different predetermined ranges or timing windows associated with respective types of injectors. For example, each range may represent a window of time associated with an injector type, as described below with respect to windows 524, 534, 574, and 584 (FIGS. 5A and 5B). Each window may also be associated with a particular current limit of test signal generator 220.

ECM 80 may be configured to generate outputs 240, including outputs for controlling components of internal combustion engine 14 and for performing a test to identify one or more injectors 30 and 34. In order to perform such a test, ECM 80 may generate one or more test signals 242 as outputs. Test signal 242 may include commands that supply relatively small quantities of current to a solenoid coil 40, which may be monitored via sensors 98. Test signal 242 may be generated as a part of a test performed in response to a request to startup of engine 14 (e.g., when powering up components associated with engine 14 before engine 14 starts). Outputs 240 may also include commands that are generated as one or more corrective actions performed based on the identification of injectors 30 or 34. For example, outputs 240 may include one or more notifications 244 and/or engine control signals, such as a derate signal 246.

ECM 80 may generate and transmit injector notification 244 to notification device 90 (FIG. 1), such as a display within a cabin of a machine, a display of a computing device in communication with ECM 80, a mobile device of an operator, supervisor, fleet manager, service center, or other entity that monitors the operation of a machine including engine 14. Injector notification 244 may correspond to one or more diagnostic codes (e.g., on-board diagnostic codes) generated for diagnosing and troubleshooting engine 14, and may identify one or more particular injector types, as well as the location (e.g., cylinder location) of injector responsible for the diagnostic code. Additionally or alternatively, injector notification 244 may include a prompt informing a user of a characteristic (e.g., a type) of an installed injector and a mismatch between ECM 80 and this injector.

ECM 80 may also generate, as an output, a derate signal 246 that limits aspects of the performance of engine 14. For example, derate signal 246 may correspond to command signals that prevent engine 14 from operating above a pre-determined engine speed and/or above a predetermined load or power. Additionally or alternatively, derate signal 246 may include restricting an injection strategy for one or more fuel injectors. For example, derate signal 246 may correspond to commands issued to one or more fuel injectors 30 and/or 34 to restrict an injection strategy for one or more cylinders 16. This limitation may restrict an injection strategy to a single main injection for each combustion cycle, and prevent pilot and post injections (e.g., smaller injections that respectively occur immediately prior to or immediately following a main injection).

INDUSTRIAL APPLICABILITY

Fuel injector identification and control system 10 may be used in conjunction with any appropriate machine, vehicle, or other device or system that includes an internal combustion engine having one or more fuel injectors. Fuel injector system 10 may be applied to internal combustion engines in which fuel is injected by one or more electronically-controlled valves, and in particular, solenoid-actuated valves. Fuel injector system 10 may be applied in a variety of machines or vehicles, including machines applicable for earthmoving, paving, power generation, mining, marine applications, transportation, or others. Fuel injector system 10 may be of particular use in systems having replaceable fuel injectors.

In some engine systems, it may be desirable to replace one or more fuel injectors with a fuel injector having different operating characteristics. For example, it may be desirable to replace a series of previously-installed fuel injectors with a respective series of fuel injectors having a modified design. The replacement fuel injectors may offer improved performance, including improved responsiveness, improved control over fuel injection quantities, increased longevity, and/or other benefits. Once a new or replacement injector is installed, it may be desirable to provide ECM 80 with suitable programming for the new injector, or otherwise prepare ECM 80 for operation with the new injector. With reference to method 300 described below, in order to prevent a continuing mismatch between the new injector(s) and this programming, it may be desirable to identify one or more characteristics of a newly-installed or replacement injector with a control unit for the injector. For example, system 10 may include an ECM 80 that acts as a safeguard to ensure that an operator provides ECM 80 with the programming associated with fuel injector 34.

FIG. 3 is a flowchart illustrating an exemplary method 300 for identifying one or more characteristics of a fuel injector installed in engine 14, such as a characteristic of a fuel injector installed in a particular location of engine 14. Method 300 may be performed in response to the receipt of a request to start engine 14 or supply power to components associated with engine 14, as generated by an interaction with startup device 60 (e.g., a key-on). In some aspects, method 300 may be performed during the startup or powerup process for engine 14, in part or entirely, prior to the injection of fuel. Method 300 may be performed for each injector of engine 14. Alternatively, method 300 may be performed for a subset of the injectors.

A step 302 of method 300 may include generating a fuel injector test signal. This may include controlling one or more drive circuits 84 of ECM 80 to apply electrical energy to solenoid coils 40. Step 302 may also include boosting the energy applied to solenoid coils 40 with boosting circuit 82, resulting in boosted test current being supplied to solenoid coils 40. Step 302 may be performed by generating a single fuel injector test signal for one of the injectors, or a plurality (e.g., two) of fuel injector test signals for a particular injector in a single test.

During a step 304, ECM 80 may monitor current supplied as a test current to solenoid coils 40 of injectors 30 and 34 during the injector test. In particular, step 304 may include detecting a boosted current supplied as the test current.

A step 306 may include analyzing a test signal 242, including at least one first test signal or second test signal. In at least some embodiments, step 306 may include analyzing one or more first test signals (described below with respect to FIG. 5A) and one or more second test signals (described below with respect to FIG. 5B) prior to startup of engine 14, as part of a single test. One or more of these test signals may facilitate the identification of a fuel injector characteristic, such as an inductance and/or type of a fuel injector installed in engine 14. Details of an exemplary identification of a fuel injector characteristic is described below with respect to FIGS. 5A and 5B.

Step 308 may include performing one or more corrective actions based on the injector identified in step 306. For example, ECM 80 may compare current programming to the identified injector(s) to determine whether a mismatch exists between this programming and one or more installed injectors. For example, when ECM 80 is configured (e.g., programmed) to control first injectors 30 and a second injector 34 or associated characteristic is identified, ECM 80 perform a corrective action due to the mismatch identified in step 306. When ECM 80 is configured to control second injectors 34 and one or more first injectors 30 are detected in step 306, ECM 80 may similarly determine the existence of a mismatch and perform one or more corrective actions.

Corrective actions performed in step 308 may include, for example, derating engine 14 (e.g., limiting engine speed, shot strategy, or both) based on the detection of the above-described mismatch. If desired, the corrective action may be taken only when a plurality of test signals have a consistent result. For example, when ECM 80 is configured for first injectors 30, a corrective action may be taken only when a first test signal and a second test signal produce consistent results. If desired, ECM 80 may require a predetermined number (e.g., two, three, four, or more) of consistent results before a corrective action is taken.

In at least some configurations, the corrective action performed in step 308 may include presenting a notification on notification device 90 based on an identified characteristic, such as a type or inductance of one or more installed fuel injectors. This notification may indicate that improper programming is present on a controller (e.g., ECM 80) of system 10 that performs control of the identified injector. This notification may indicate that one or more second injectors 34 were installed in engine 14 without flashing or otherwise updating the programming of this controller, for example. The notification may also indicate the location of engine 14 at which the second injector 34 is installed. ECM 80 may be configured to identify and display one or more characteristics of an injector (e.g., injector 34), including a type of injector, a behavior of the injector (e.g., increased responsiveness to a particular voltage), or other characteristics that may be indicative of mismatch. In some aspects, step 308 may include derating engine 14 when ECM 80 identifies the presence of a type of injector (e.g., a second injector 34) that results in a mismatch with the programming of ECM 80. As described above, derating engine 14 may include limiting engine speed, engine load, injection strategy, or any combination thereof. Step 308 may include both derating engine 14 and presenting a notification via notification device 90 based on the identified characteristic(s).

Figure 4:
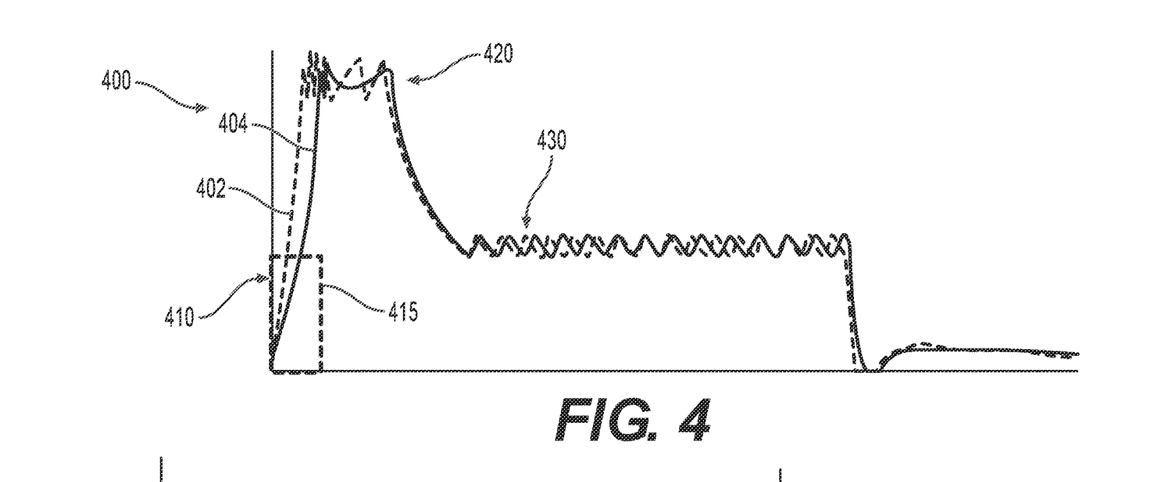
FIG. 4 is a chart illustrating exemplary monitored current waveforms of the fuel injection system of FIG. 1.

FIG. 4 illustrates exemplary waveforms 400 that may illustrate differences between current supplied to injectors 30 and 34 when ECM 80 configured for first injector 30. A faster waveform 402 may correspond to current supplied to second injector 34, while a slower waveform 404 may correspond to first injector 30. Slower waveform 404 and faster waveform 402 reflect an amplitude of current supplied to solenoid coils 40 of first injector 30 and second injector 34, respectively, for the same set of control signals issued by ECM 80. Thus, waveforms 404 and 402 represent differences in an amount of current that is supplied to injectors 30 and 34 when the same voltages are applied by boost and drive circuitry 82 and 84.

Waveforms 402 and 404 may each begin with a ramp-up current 410. Ramp-up currents 410 may rise at different rates due to differences in inductance between injectors 30 and 34. These differences may be observed during an initial ramp-up period 415. Additional differences in current may also occur in pull-in current 420 and hold-in current 430 portions of waveforms 402 and 404, as shown in FIG. 4. Due to these differences, waveform 402 may correspond to relatively imprecise control of injector 34, due to a mismatch between the programming of ECM 80 and injector 34.

FIG. 5A is a chart showing waveforms 500, which may be examples of test signals 242 observed as monitored current 214. Waveforms 500 may include a faster waveform 502 and a slower waveform 504. Faster waveform 502 may correspond to an example of current supplied to solenoid coils 40 of second injector 34 as a first test signal 242 (e.g., by applying a boosted voltage to a circuit including solenoid coils 40). Similarly, slower waveform 504 is an example of current supplied to coils 40 of first injector 30 as a first test signal 242. Waveforms 502 and 504 may correspond to the same voltage applied to solenoid coils 40. The difference in the rate at which waveforms 502 and 504 increase may be due, at least in part, to the difference in inductances between injectors 30 and 34, with second injector 34 having the lower inductance and a higher rate of increase, as reflected by waveform 502.

First test signal 242 may continue until the monitored current (e.g., waveform 502 or 504) reaches a predetermined limit current 510 or until a maximum current duration is reached. Predetermined limit current 510 and the maximum current duration may be values stored in a memory of ECM 80 for injector test signal generator 220. While the values of limit current 510 and the maximum current duration associated may be values that allow identification of both first injector 30 and second injector 34, they may be particularly suitable and more accurate for identification of second injector 34 (e.g., a type of injector having a lower inductance).

A plurality of timing windows may be applied during the application of the first test signal 242 to facilitate the identification of one or more injector characteristics. For example, an advanced timing window 524 may extend for a period of time useful for identifying second injector 34, while a delayed timing window 534 may extend for a different period of time useful for identifying first injector 30. ECM 80 may determining the timing at which a waveform reaches predetermined threshold limit current 510, and determine whether this timing is within either of windows 524 and 534. When this timing is within window 524, ECM 80 may identify a corresponding characteristic of the injector (e.g., the injector has a low inductance and/or is a second injector 34). When this timing is within window 534, ECM 80 may determine that the injector has a high inductance and/or is a first injector 30. If desired, ECM 80 may repeat the generation of a first test signal and/or perform a second test signal 242, described below, to confirm this result.

FIG. 5B is a chart showing waveforms 550, which are additional examples of test signals 242 observed as monitored current 214. Waveforms 550 may include a faster waveform 552 and a slower waveform 554. Faster waveform 552 may correspond to current supplied to solenoid coils 40 of second injector 34 as a second test signal 242. Slower waveform 554 is an example of current supplied to coils 40 of first injector 30 as a second test signal 242. This second test signal 242 may be applied until predetermined limit current 560 is reached, or until a maximum current duration is reached.

Predetermined limit current 560 and the associated maximum current duration may be values stored in ECM 80 for injector test signal generator 220. These values may facilitate accurate identification of first injector 30 (e.g., a type of injector having a higher inductance). In particular, predetermined limit current 560 may be a value lower than the value of limit current 510, and may have increased accuracy for identification of an injector with a higher inductance, such as injector 30. As shown in FIG. 5B, an advanced timing window 574 may extend for a period of time useful for identifying second injector 34, while a delayed timing window 584 may extend for a later period of time useful for identifying first injector 30. Thus, when limit current 560 is reached during window 574, ECM 80 may determine that an injector belonging to a low inductance type, such as second injector 34, is present. When limit current 560 is reached during window 584, ECM 80 may determine that an injector of a high inductance type such as first injector 30 is present.

In some aspects, waveforms 500 and 550 may be employed to identify a short-circuit condition and/or an open condition. For example, when limit current 510 is reached at a time prior to window 524 (e.g., prior to a predetermined threshold that is earlier than a beginning of window 524), ECM 80 may determine that a short condition is present, and present a suitable notification. When limit current 510 is reached after a predetermined timing (e.g., a timing later than the end of window 534), ECM 80 may determine that an open condition exists. A similar analysis may be performed for waveforms 550. The thresholds for determining the short condition and/or open condition may be changed after the conclusion of the first and second test signals so as to accurately identify a short condition or an open condition.

While the above-described exemplary system and method may be useful for identification of characteristics of two different types of injectors, aspects of this disclosure may also facilitate the identification of a larger number of characteristics and injector types. For example, by providing three, four, or more windows, it may be possible to identify an increased number of injectors. Additional or different test signals may be generated to facilitate the identification of larger number of injector types. While exemplary systems and methods may be useful for identifying a characteristic of a fuel injector based on electrical current, electrical energy may also be monitored to identify one or more characteristics (e.g., by determining a rise time of electrical energy). In configurations where voltage is known, but is not controlled, for example, the rise time of voltage may be monitored (e.g., based on a predetermined nominal voltage value) instead of, or in addition to, the rise time of electrical current.

In some engine systems, it may be desirable to replace or upgrade fuel injectors during the life of the engine. When one or more injectors are replaced with such upgrade fuel injector types, control software should be updated to ensure the waveforms for controlling the new injector type achieve the desired behavior. Systems that monitor the injectors and are capable of identifying a characteristic of the injector, such as an injector type or inductance, may provide a failsafe in the event that an operator fails to update controller software after replacing one or more fuel injectors. When a mismatch between the engine control software and one or more fuel injectors is detected, the engine may be controlled in a manner that prevents advanced timing, excessive fueling, and merged injection shots, which may otherwise occur due to inability to precisely control the mismatched injector. For example, a derate mode may be entered to avoid unstable performance or engine damage. Additionally or alternatively, a notification may be provided to prompt an operator to update controller programming or install a correct injector. Thus, it may be possible to avoid excessively high cylinder pressure, high torque, high temperatures, or other potential sources of engine damage, as well as prevent the increased emission of undesirable exhaust components.

It will be apparent to those skilled in the art that various modifications and variations can be made to the disclosed method and system without departing from the scope of the disclosure. Other embodiments of the method and system will be apparent to those skilled in the art from consideration of the specification and practice of the apparatus and system disclosed herein. It is intended that the specification and examples be considered as exemplary only, with a true scope of the disclosure being indicated by the following claims and their equivalents.

What is claimed is:

1. A method for identifying a fuel injector characteristic, the method comprising:
   generating a signal to supply electrical current to the fuel injector;
   monitoring the electrical current supplied to the fuel injector;
   identifying the characteristic of the fuel injector based on a rise time of the electrical current to a predetermined current threshold above zero, the characteristic including whether the fuel injector belongs to a first type of fuel injector or a second type of fuel injector, wherein identifying the characteristic includes:
   determining that the fuel injector belongs to a first type when the rise time is later than an expected timing; or
   determining that the fuel injector belongs to a second type when the rise time is before the expected timing; and
   performing a corrective action based on determining that the fuel injector belongs to the second type based on the electrical current, when a control unit in communication with the fuel injector includes programming suitable for the first type, the first type having a higher inductance than the second type.

2. The method of claim 1, wherein the corrective action includes transmitting a notification indicative of the type of fuel injector.

3. The method of claim 1, wherein the corrective action includes displaying a notification indicative of a mismatch between programming on the control unit and the fuel injector.

4. The method of claim 1, wherein the corrective action includes derating an internal combustion engine in which the fuel injector is installed by preventing the internal combustion engine from operating above a predetermined engine speed and/or power.

5. The method of claim 1, wherein the corrective action includes derating an internal combustion engine in which the fuel injector is installed by restricting an injection strategy for the fuel injector.

6. The method of claim 1, wherein the electrical current is generated until the monitored electrical current reaches the predetermined current threshold and the fuel injector is not fully actuated by the monitored electrical current.

7. The method of claim 6, wherein the electrical current continuously increases until reaching the predetermined current threshold.

8. The method of claim 1, wherein the expected timing is a beginning of a predetermined timing window for identifying fuel injectors belonging to the first type.

9. A method for identifying a fuel injector, the method comprising:
   supplying a test current to a circuit for controlling the fuel injector of an internal combustion engine, the circuit including a solenoid;
   monitoring the test current supplied to the solenoid;
   identifying a type of the fuel injector from among a first type and a second type according to an inductance of the fuel injector and based on a rise time of the monitored test current in which an amount of current increases positively by an amount that does not fully actuate the fuel injector, the first type having a higher inductance than the second type; and
   generating a notification based on the type of fuel injector, the notification being displayed so as to indicate a mismatch between programming on a control unit and the fuel injector, the control unit being in communication with the fuel injector.

10. The method of claim 9, wherein the type of fuel injector is identified based on whether the rise time of the monitored test current reaches a threshold current within a predetermined timing window.

11. The method of claim 9, wherein the test current is supplied as a plurality of separate test waveforms when engine speed of the internal combustion engine is zero.

12. The method of claim 9, wherein the type of fuel injector is identified based on a timing when the test current reaches a predetermined current threshold.

13. The method of claim 9, further including modifying an operation of the internal combustion engine based on the mismatch between the programming on the control unit the fuel injector.

14. A fuel injector system, comprising:
   an internal combustion engine;
   a current sensor configured to generate a signal indicative of an amount of current detected in a circuit associated with a fuel injector; and
   a controller configured to:
   generate a signal that causes current to be supplied to the circuit, which includes a solenoid of a fuel injector;
   monitor current supplied to the solenoid in response to the signal;
   identify a first type of fuel injector based on whether an increase in the monitored current to a first predetermined current threshold occurs within a first predetermined timing window according to the first type of fuel injector having a first inductance;
   identify a second type of fuel injector based on whether the increase in the monitored current to a second predetermined current threshold occurs within a second predetermined timing window according to the second type of fuel injector having a second inductance that is different than the first inductance; and perform an action based on the type of fuel injector, including generating a notification indicative of a status of the fuel injector or a status of the controller, in response to the increase in the monitored current to the second predetermined current occurring within the second predetermined timing window, the second predetermining timing window extending earlier than the first predetermined timing window.

15. The fuel injector system of claim 14, wherein the action includes generating a notification and modifying an operation of the internal combustion engine.

16. The fuel injector system of claim 15, wherein modifying the operation of the internal combustion engine includes derating the internal combustion engine.

17. The fuel injector system of claim 14, wherein the action includes generating a notification indicative of a mismatch between the controller and the type of fuel injector.

18. The fuel injector system of claim 14, wherein the signal is a test signal and the monitored current does not actuate the fuel injector.

19. The fuel injector system of claim 18, wherein the controller is further configured to generate a plurality of test signals prior to performing the action.

20. The fuel injector system of claim 14, wherein the first predetermined current threshold and the second predetermined current threshold are different current values.

* * * * *